(12) United States Patent
Kim

(10) Patent No.: US 7,944,260 B2
(45) Date of Patent: May 17, 2011

(54) CLOCK CONTROL CIRCUIT AND A SEMICONDUCTOR MEMORY APPARATUS HAVING THE SAME

(75) Inventor: Kwan Dong Kim, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 20 days.

(21) Appl. No.: 12/407,183

(22) Filed: Mar. 19, 2009

(65) Prior Publication Data
US 2009/0278580 A1 Nov. 12, 2009

(30) Foreign Application Priority Data

May 9, 2008 (KR) .................. 10-2008-0043657

(51) Int. Cl.
*H03L 7/06* (2006.01)
(52) U.S. Cl. ........................................ 327/158; 327/149
(58) Field of Classification Search .................. 327/149, 327/158
See application file for complete search history.

(56) References Cited

U.S. PATENT DOCUMENTS

| | | | |
|---|---|---|---|
| 6,404,248 B1* | 6/2002 | Yoneda | 327/158 |
| 6,731,148 B2* | 5/2004 | Lau et al. | 327/158 |
| 6,836,153 B2* | 12/2004 | Birrittella | 327/3 |
| 6,963,235 B2 | 11/2005 | Lee | |
| 7,027,548 B1* | 4/2006 | Palusa et al. | 375/375 |
| 7,479,814 B1* | 1/2009 | Kaviani et al. | 327/156 |
| 7,482,848 B2* | 1/2009 | Lee | 327/158 |
| 7,830,186 B2* | 11/2010 | Yun et al. | 327/158 |
| 2002/0036527 A1* | 3/2002 | Yoneda | 327/158 |
| 2003/0227308 A1* | 12/2003 | Cooper | 327/158 |
| 2007/0247203 A1 | 10/2007 | Cho et al. | |
| 2009/0168552 A1* | 7/2009 | Yoon et al. | 365/189.07 |
| 2010/0283520 A1* | 11/2010 | Ku | 327/158 |

FOREIGN PATENT DOCUMENTS

| | | |
|---|---|---|
| JP | 10-285020 | 10/1998 |
| JP | 2002-042469 | 2/2002 |
| JP | 2005-135567 | 5/2005 |
| KR | 102004000092 A | 1/2004 |
| KR | 102008002027 A | 3/2008 |

* cited by examiner

*Primary Examiner* — Lincoln Donovan
*Assistant Examiner* — Adam D Houston
(74) *Attorney, Agent, or Firm* — IP & T Group LLP

(57) ABSTRACT

A clock control circuit includes a clock delay device, an edge detection device, a phase determination device and a delay control device. The clock delay device generates a delayed rising clock and a delayed falling clock by delaying a rising clock and a falling clock, which are transferred from a clock generation circuit, in response to a control signal, and to transfer the delayed rising clock and the delayed falling clock to a data output buffer. The edge detection device detects a difference between an edge timing of the delayed rising clock and an edge timing of the delayed falling clock to generate edge detection signals. The phase determination device detects a duty ratio of each of the edge detection signals to generate phase determination signals. The delay control device generates the control signal in response to the phase determination signals.

11 Claims, 8 Drawing Sheets

CLOCK CONTROL CIRCUIT AND A SEMICONDUCTOR MEMORY APPARATUS HAVING THE SAME

CROSS-REFERENCES TO RELATED APPLICATION

The present application claims priority under 35 U.S.C. 119(a) to Korean application number 10-2008-0043657, filed on May 9, 2008, in the Korean Patent Office, which is incorporated by reference in its entirety as if set forth herein in full.

BACKGROUND OF THE INVENTION

1. Technical Field

The present invention relates to a semiconductor memory device, and more particularly to a clock control circuit of a semiconductor memory device.

2. Related Art

In general, a semiconductor memory device includes a clock generation circuit such as a delay locked loop (DLL) circuit or a phase locked loop (PLL) circuit to generate an internal clock having a phase advanced by a predetermined time as compared with that of an external clock. In a semiconductor memory device such as a double data rate synchronous dynamic random access memory (DDR SDRAM), the internal clock output from the clock generation circuit includes a rising clock and a falling clock. The rising clock has a phase to output data at rising edge time of the external clock through a duty cycle correction operation after the internal clock is generated. Further, the falling clock has a phase to output data at falling edge time of the external clock.

A data output buffer provided in the semiconductor memory device alternately buffers rising data and falling data, which are transferred through a global line GIO, in synchronization with the rising clock and the falling clock, and then outputs the rising data and the falling data. When the rising clock has a phase opposite to that of the falling clock, the data output buffer can operate stably. However, since the data output buffer is not adjacent to the clock generation circuit, the phases of the rising and falling clocks are affected by delay devices existing on a transmission path forwarding to the data output buffer.

As illustrated in FIG. 1, if the phase of the rising clock 'rclk' is not opposite to the phase of the falling clock 'fclk', which are transmitted to the data output buffer, data 'd_out' does not have a uniform period. In detail, a data bit synchronized with the falling clock 'fclk' may have a shorter output section as compared with a data bit synchronized with the rising clock 'rclk'. In such a case, the stability may deteriorate in a data output operation. If such phenomenon becomes more pronounced, data synchronized with the falling clock 'fclk' may not be output, so that distorted data may be output.

As described above, in order to stably perform a data output operation in the semiconductor memory device, the phase of the rising clock must be opposite to the phase of the falling clock, which is transmitted to the data output buffer. However, according to the related art, the rising and falling clocks having distorted phases are transmitted to the data output buffer due to delay devices existing on a transmission path between the clock generation circuit and the data output buffer, so that stability of the data output operation may deteriorate. In this regard, a method for stably transmitting a clock is required to improve reliability of the data output operation.

SUMMARY

A clock control circuit capable of subsequently correcting phases of rising and falling clocks generated through a primary duty cycle correction, which are distorted during transmission to a data output buffer through a transmission line, and a semiconductor memory device having the same are described herein.

Further, a clock control circuit, which can improve stability of a data output operation, and a semiconductor memory device having the same are described herein.

According to one aspect, a clock control circuit includes a clock delay device configured to generate a delayed rising clock and a delayed falling clock by delaying a rising clock and a falling clock, which are transferred from a clock generation circuit, in response to a control signal, and to transfer the delayed rising clock and the delayed falling clock to a data output buffer, an edge detection device configured to detect a difference between an edge timing of the delayed rising clock and an edge timing of the delayed falling clock to generate edge detection signals, a phase determination device configured to detect a duty ratio of each of the edge detection signals to generate phase determination signals, and a delay control device configured to generate the control signal in response to the phase determination signals.

According to another aspect, a semiconductor memory device includes a clock generation circuit configured to generate an internal clock by delaying an external clock by predetermined time, a duty cycle correction circuit configured to generate a rising clock and a falling clock by correcting a duty cycle of the internal clock, a transmission line configured to transmit the rising clock and the falling clock, a clock control circuit configured to generate a delayed rising clock and a delayed falling clock by delaying the rising clock and the falling clock, wherein a rising edge of the rising clock matches with a falling edge of the falling clock and the rising clock and the falling clock are transferred through the transmission line, and a data output buffer configured to buffer output data in response to the delayed rising clock and the delayed falling clock.

According to another aspect, a method includes generating a delayed rising clock and a delayed falling clock by delaying a rising clock and a falling clock in response to a control signal, transferring the delayed rising clock and the delayed falling clock to a data output buffer, detecting a difference between an edge timing of the delayed rising clock and an edge timing of the delayed falling clock to generate edge detection signals, detecting a duty ratio of each of the edge detection signals to generate phase determination signals, and generating the control signal in response to the phase determination signals.

According to the present disclosure as described above, the clock control circuit and the semiconductor memory device for subsequently correcting phases of the rising clock and the falling clock generated through a primary duty cycle correction, which are distorted during transmission through the transmission line, to allow the rising clock and the falling clock to have phases opposite to each other, thereby stably performing a data output operation.

Further, according to the clock control circuit and the semiconductor memory device having the same, the data output buffer can output rising data and falling data without loss, so that reliability of output data can be improved.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
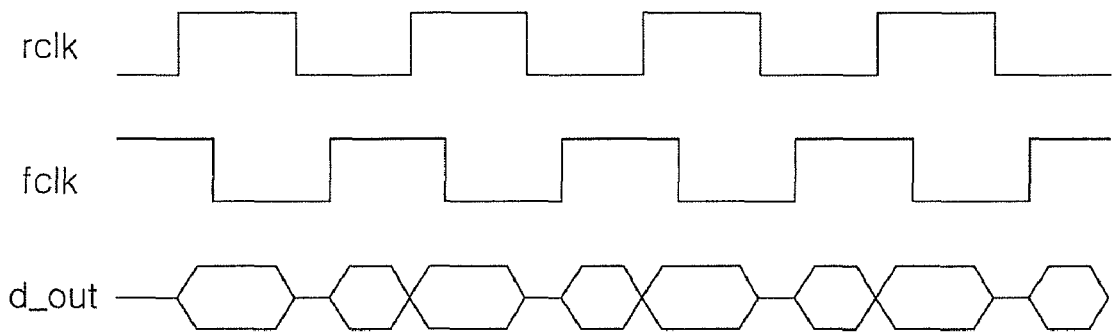
FIG. 1 is a timing chart illustrating an operation of a conventional semiconductor memory device.
Figure 2:
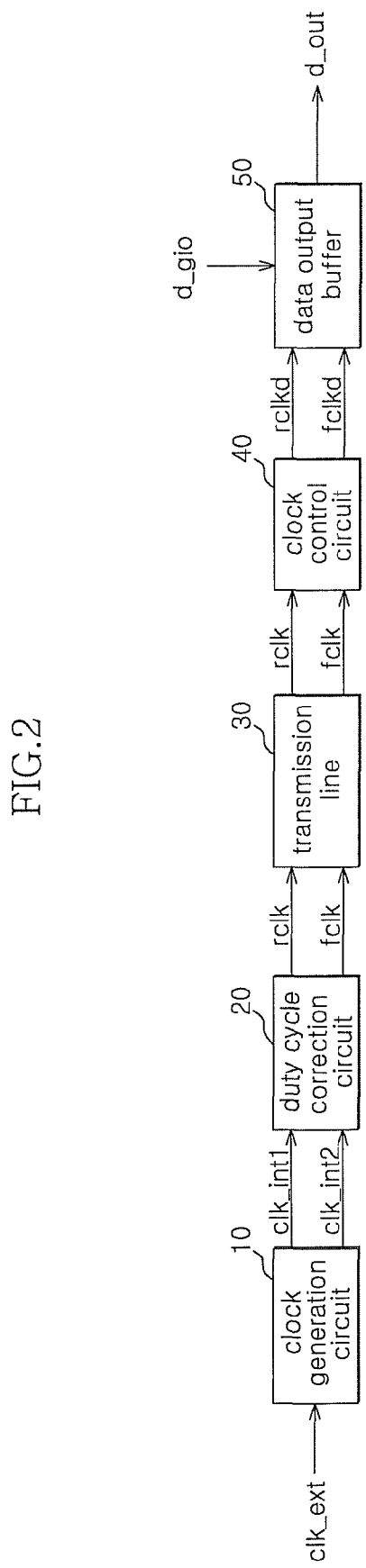
FIG. 2 is a block diagram illustrating a configuration of a semiconductor memory device in accordance with one embodiment of the present disclosure.

FIG. 2 is a block diagram illustrating a configuration of a semiconductor memory device in accordance with one embodiment of the present disclosure.

As illustrated in FIG. 2, the semiconductor memory device can include a clock generation circuit 10, a duty cycle correction circuit 20, a transmission line 30, a clock control circuit 40 and a data output buffer 50. The clock generation circuit 10 can be configured to generate a first internal clock 'clk_int1' and a second internal clock 'clk_int2' by delaying an external clock 'clk_ext' by predetermined time. The duty cycle correction circuit 20 can be configured to generate a rising clock 'rclk' and a falling clock 'fclk' by correcting duty cycles of the first internal clock 'clk_int1' and the second internal clock 'clk_int2'. The transmission line 30 can be configured to transmit the rising clock 'rclk' and the falling clock 'fclk'. The clock control circuit 40 can be configured to delay the rising clock 'rclk' and the falling clock 'fclk', which are received through the transmission line 30, until a rising edge of the rising clock 'rclk' matches with a falling edge of the falling clock 'fclk', thereby generating a delayed rising clock 'rclkd' and a delayed falling clock 'fclkd'. The data output buffer 50 outputs output data 'd_out' by buffering global data 'd_gio' in response to the delayed rising clock 'rclkd' and the delayed falling clock 'fclkd'.

The generation circuit 10 can be easily realized using a DLL circuit or a PLL circuit. The duty cycle correction circuit 20 has a general configuration which can be easily embodied by persons skilled in the art.

Further, duty cycles and phases of the rising clock 'rclk' and the falling clock 'fclk', which are transferred through the transmission line 30, are primarily controlled by the duty cycle correction circuit 20. However, the rising clock 'rclk' and the falling clock 'fclk' have phases delayed by predetermined time due to delay caused by the transmission line 30. Thus, when the rising clock 'rclk' and the falling clock 'fclk' are input to the clock control circuit 40, the rising clock 'rclk' and the falling clock 'fclk' may not have phases opposite to each other. The clock control circuit 40 secondarily controls the phases of the rising clock 'rclk' and the falling clock 'fclk' to allow the phase of the rising clock 'rclk' to be opposite to that of the falling clock 'fclk'. In detail, the clock control circuit 40 properly delays the rising clock 'rclk' and the falling clock 'fclk' to generate the delayed rising clock 'rclkd' and the delayed falling clock 'fclkd'. Further, the clock control circuit 40 detects edges of the delayed rising clock 'rclkd' and the delayed falling clock 'fclkd' to determine phase difference between the rising clock 'rclk' and the falling clock 'fclk' based on the edge detection result.

Thus, the phase of the delayed rising clock 'rclkd' can be opposite to that of the delayed falling clock 'fclkd' through the configuration and operation the clock control circuit 40 as described above. Consequently, the data output buffer 50 can stably perform a buffering operation relative to the global data 'd_gio'.

Figure 3:
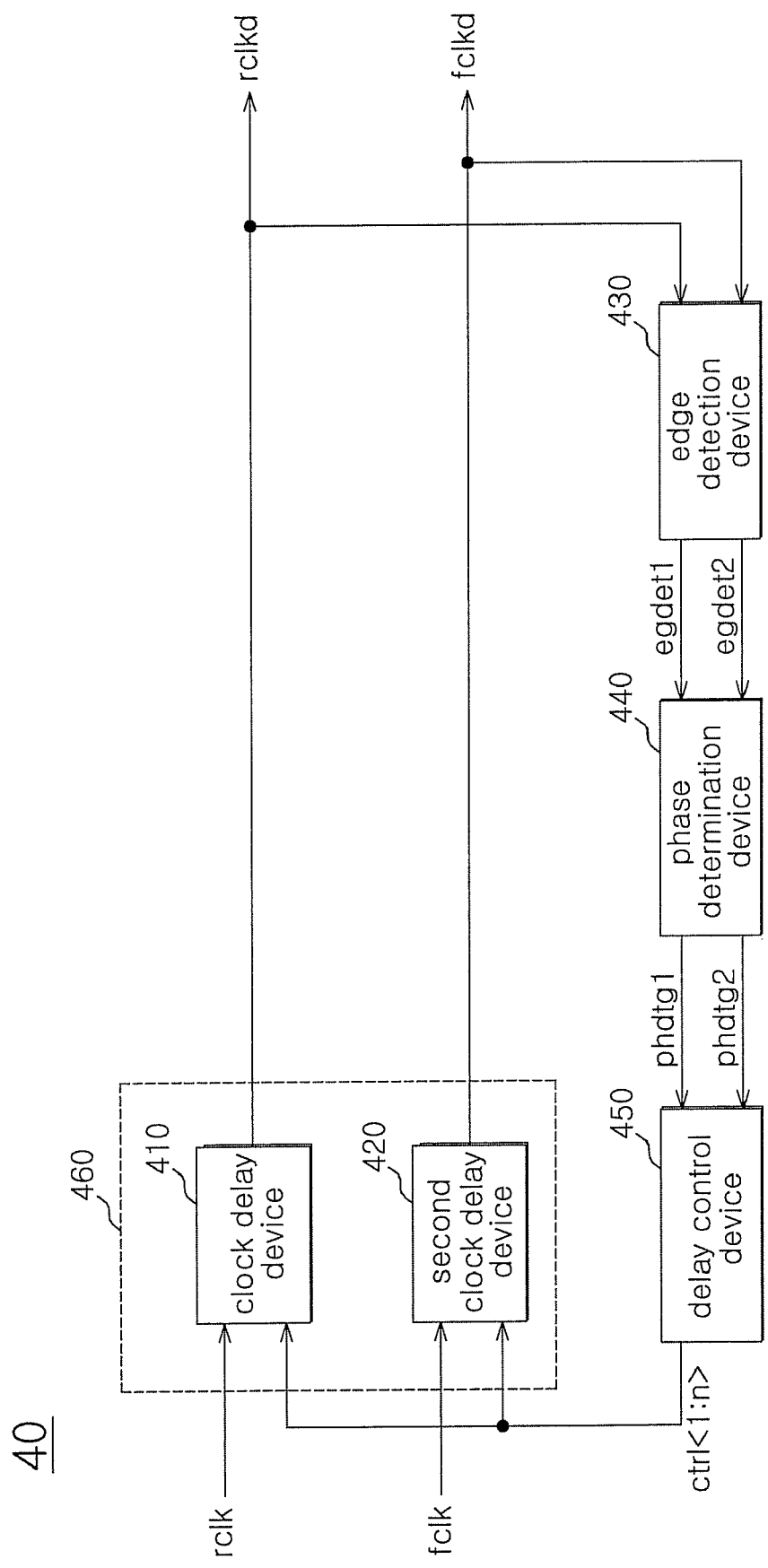
FIG. 3 is a detailed block diagram illustrating a configuration of the clock control circuit shown in FIG. 2.

FIG. 3 is a detailed block diagram illustrating a configuration of the clock control circuit shown in FIG. 2.

As illustrated in FIG. 3, the clock control circuit 40 can include a first clock delay device 410, a second clock delay device 420, an edge detection device 430, a phase determination device 440 and a delay control device 450.

The first clock delay device 410 can be configured to generate the delayed rising clock 'rclkd' by delaying the rising clock 'rclk' in response to an n-bit control signal 'ctrl<1:n>', and the second clock delay device 420 can be configured to generate the delayed falling clock 'fclkd' by delaying the falling clock 'fclk' in response to the n-bit control signal 'ctrl<1:n>'.

The edge detection device 430 can be configured to detect difference between edge timing of the delayed rising clock 'rclkd' and edge timing of the delayed falling clock 'fclkd' to generate a first edge detection signal 'egdet1' and a second edge detection signal 'egdet2'. The phase determination device 440 can be configured to detect a duty ratio of the first edge detection signal 'egdet1' and the second edge detection signal 'egdet2' to generate a first phase determination signal 'phdtg1' and a second phase determination signal 'phdtg2'.

The delay control device 450 can be configured to generate the n-bit control signal 'ctrl<1:n>' in response to the first phase determination signal 'phdtg1' and the second phase determination signal 'phdtg2'.

The first clock delay device 410 and the second clock delay device 420 may be commonly referred to as a clock delay device 460. In detail, the clock delay device 460 can be configured to delay the rising clock 'rclk' and the falling clock 'fclk' in response to the n-bit control signal 'ctrl<1:n>', thereby generating the delayed rising clock 'rclkd' and the delayed falling clock 'fclkd', which have phases opposite to each other.

The n-bit control signal 'ctrl<1:n>' generated from the delay control device 450 can be configured to control the delay operations of the first clock delay device 410 and the second clock delay device 420, so that the phase of the delayed rising clock 'rclkd' can be opposite to that of the delayed falling clock 'fclkd'.

Then, the edge detection device 430 can be configured to generate the first edge detection signal 'egdet1' that has a high level section from rising edge timing of the delayed rising clock 'rclkd' to rising edge timing of the delayed falling clock 'fclkd', and a low level section from the rising edge timing of the delayed falling clock 'fclkd' to the rising edge timing of the delayed rising clock 'rclkd'. Further, the edge detection device 430 can be configured to generate the second edge detection signal 'egdet2' that has a high level section lo from the rising edge timing of the delayed falling clock 'fclkd' to the rising edge timing of the delayed rising clock 'rclkd', and a low level section from the rising edge timing of the delayed rising clock 'rclkd' to the rising edge timing of the delayed falling clock 'fclkd'. The first edge detection signal 'egdet1' and the second edge detection signal 'egdet2' generated by the operation of the edge detection device 430 are configured to have a duty ratio of 50:50 when the phase of the delayed rising clock 'rclkd' is opposite to that of the delayed falling clock 'fclkd'. Otherwise, the high level section is wider than the low level section or vice versa and phases thereof are opposite to each other.

When the first edge detection signal 'egdet1' has a high section wider than a low section, the phase determination device 440 generates the first phase determination signal 'phdtg1' having low-level potential and the second phase determination signal 'phdtg2' having high-level potential. In contrast, when the first edge detection signal 'egdet1' has the low section wider than the high section, the phase determination device 440 generates the first phase determination signal 'phdtg1' having high-level potential and the second phase determination signal 'phdtg2' having low-level potential. In detail, the phase determination device 440 determines a duty ratio of the first edge detection signal 'egdet1' and the second edge detection signal 'egdet2' to generate the first phase determination signal 'phdtg1' and the second phase determination signal 'phdtg2' according to the determination result, which have potential levels opposite to each other.

The delay control device 450 can be configured to vary logic values of the control signal 'ctrl<1:n>' including n-bit digital signals in response to the first phase determination signal 'phdtg1' and the second phase determination signal 'phdtg2'. In detail, when the first phase determination signal 'phdtg1' has low-level potential and the second phase determination signal 'phdtg2' has high-level potential, the delay control device 450 can be prepared in the form of a counter that increases the number of bits having a logic value of 0 in the n-bit control signal 'ctrl<1:n>'. Since the configuration of the delay control device 450 performing the above operation is well known to persons skilled in the art, detailed description thereof will be omitted.

As described above, the clock control circuit 40 in accordance with one embodiment of the present disclosure can be configured to delay the rising clock 'rclk' and the falling clock 'fclk' such that the rising edge of the delayed rising clock 'rclkd' has a phase opposite to that of the falling edge of the delayed falling clock 'fclkd'. To this end, the clock control circuit 40 detects difference between the rising edge timing of the delayed rising clock 'rclkd' and the rising edge timing of the delayed falling clock 'fclkd', and determines phase difference between the delayed rising clock 'rclkd' and the delayed falling clock 'fclkd' based on the detection result, thereby adjusting delay of the rising clock 'rclk' and delay of the falling clock 'fclk'. Thus, the delayed rising clock 'rclkd' can have a phase opposite to that of the delayed falling clock 'fclkd', so that a data output operation of the semiconductor memory device can be stably performed.

Figure 4A:
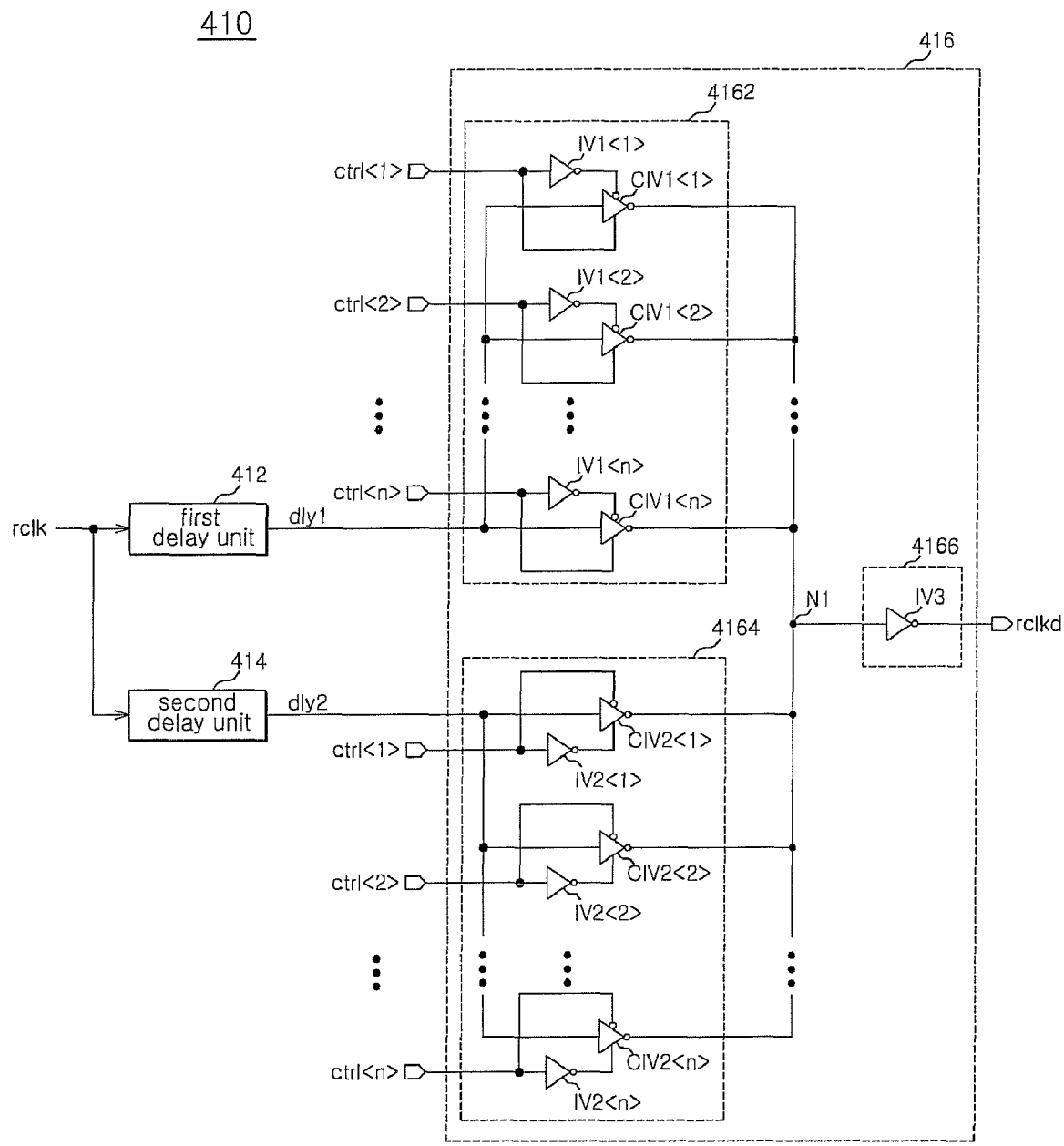
FIG. 4A is a detailed block diagram illustrating a configuration of a first clock delay device shown in FIG. 3.
Figure 4B:
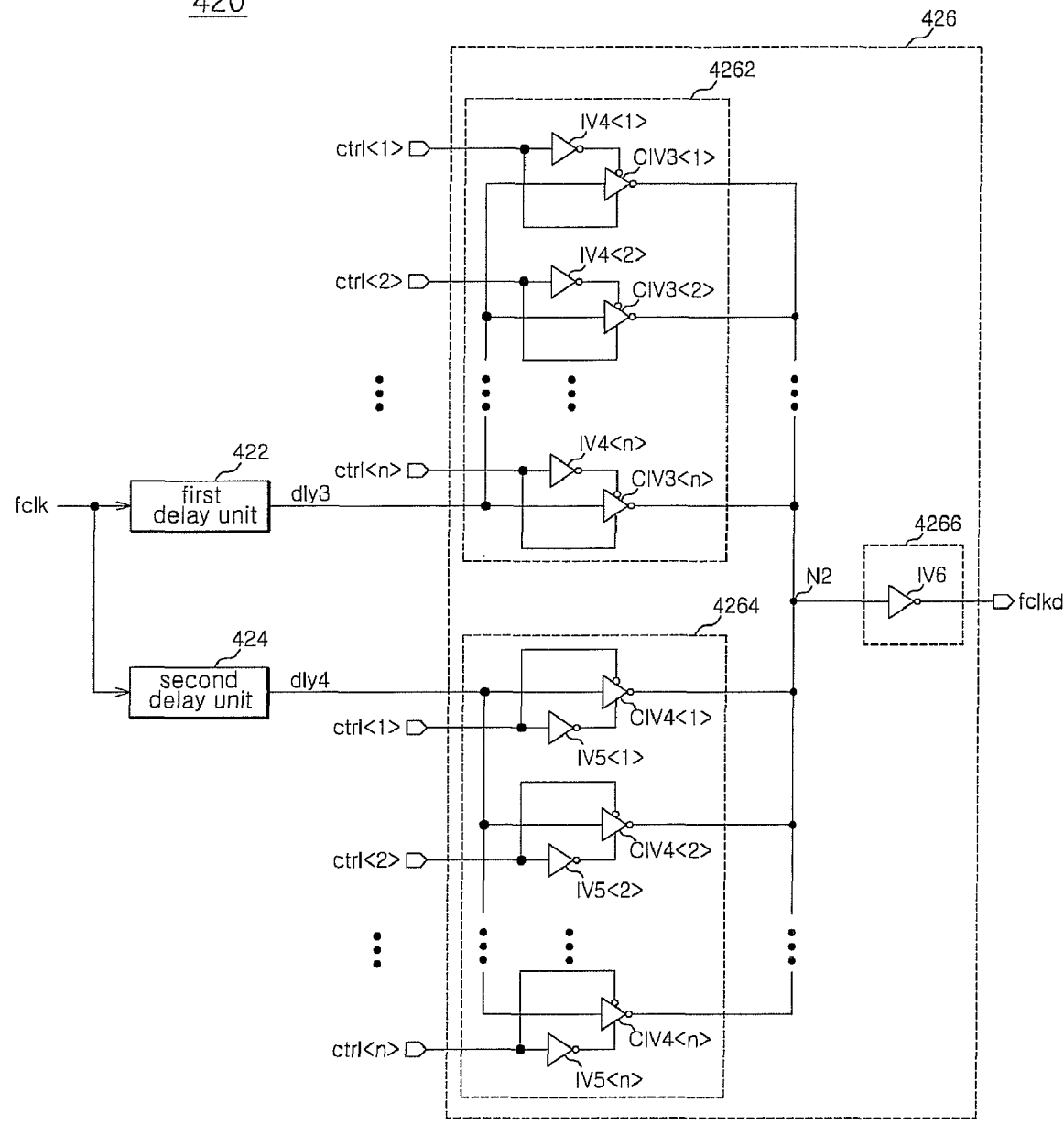
FIG. 4B is a detailed block diagram illustrating a configuration of a second clock delay device shown in FIG. 3

FIG. 4A is a detailed block diagram illustrating a configuration of the first clock delay device shown in FIG. 3 and FIG. 4B is a detailed block diagram illustrating a configuration of the second clock delay device shown in FIG. 3.

As illustrated in FIG. 4A, the first clock delay device 410 can include a first delay unit 412, a second delay unit 414 and a first phase mixing unit 416.

The first delay unit 412 can be configured to generate a first delay signal 'dly1' by delaying the rising clock 'rclk' by first time, and the second delay unit 414 can be configured to generate a second delay signal 'dly2' by delaying the rising clock 'rclk' by second time. The first phase mixing unit 416 can be configured to generate the delayed rising clock 'rclkd' by mixing a phase of the first delay signal 'dly1' with a phase of the second delay signal 'dly2' in response to the n-bit control signal 'ctrl<1:n>'.

The first time of the first delay unit 412 is different from the second time of the second delay unit 414. The following description will be given on the assumption that the first time is longer than the second time. The configurations of the first delay unit 412 and the second delay unit 414 can be realized through a combination of a plurality of delay devices.

The first phase mixing unit 416 can include a first driving unit 4162, a second driving unit 4164 and a third driving unit 4166.

Further, the first phase mixing unit 416 can include a first node N1. The first driving unit 4162 can be configured to drive the first delay signal 'dly1' in response to the n-bit control signal 'ctrl<1:n>' and transfers the first delay signal 'dly1' to the first node N1. The second driving unit 4164 can be configured to drive the second delay signal 'dly2' in response to the n-bit control signal 'ctrl<1:n>' and transfers the second delay signal 'dly2' to the first node N1. The third driving unit 4166 can be configured to drive the signals transferred to the first node N1 to generate the delayed rising clock 'rclkd'.

The first driving unit 4162 can include N number of first inverters IV1<1:n>, which receive bits of the n-bit control signal 'ctrl<1:n>', and N number of first control inverters CIV1<1:n>. The first control inverters CIV1<1:n>can be configured to drive the first delay signal 'dly1' in response to the bits of the n-bit control signal 'ctrl<1:n>' and an output signal of a corresponding inverter of the first inverters IV1<1:n>, thereby outputting the first delay signal 'dly1' to the first node N1.

The second driving unit 4164 can include N number of second inverters IV2<1:n>, which receive bits of the n-bit control signal 'ctrl<1:n>', and N number of second control inverters CIV2<1:n>. The second control inverters CIV2<1:n> can be configured to drive the second delay signal 'dly2' in response to the bits of the n-bit control signal 'ctrl<1:n>' and an output signal of a corresponding inverter of the second inverters IV2<1:n>, thereby outputting the second delay signal 'dly2' to the first node N1.

The third driving unit 4166 can include a third inverter IV3.

The number of the control inverters activated in the first driving unit 4162 and the number of the control inverters activated in the second driving unit 4164 are determined according to potential levels of the n-bit control signal 'ctrl<1:n>'. If the first driving unit 4162 has driving force higher than that of the second driving unit 4164 by controlling the n-bit control signal 'ctrl<1:n>', the delayed rising clock 'rclkd' has a phase similar to that of the first delay signal 'dly1' rather than that of the second delay signal 'dly2'. As described above, the first phase mixing unit 416 can adjust the number of the control inverters activated in the first driving unit 4162 and the second driving unit 4164 in response to the n-bit control signal 'ctrl<1:n>', thereby precisely controlling output timing of the delayed rising clock 'rclkd'.

Meanwhile, the second clock delay device 420 has a configuration similar to that of the first clock delay device 410. In detail, the second clock delay device 420 can include a third delay unit 422, a fourth delay unit 424 and a second phase mixing unit 426 to generate a third delay signal 'dly3' and a fourth delay signal 'dly4' from the falling clock 'fclk' and then generate the delayed falling clock 'fclkd'.

The second phase mixing unit 426 can include a second node N2, a fourth driving unit 4262, a fifth driving unit 4264 and a sixth driving unit 4266. The fourth driving unit 4262 can include N number of fourth inverters IV4<1:n>and N number of third control inverters CIV3<1:n>. The fifth driving unit 4264 can include N number of fifth inverters IV5<1:n> and N number of fourth control inverters CIV4<1:n>. The sixth driving unit 4266 can include a sixth inverter IV6.

Similarly to the first clock delay device 410, the second clock delay device 420 can adjust the number of the control inverters activated in the fourth driving unit 4262 and the fifth driving unit 4264 according to the potential levels of the n-bit control signal 'ctrl<1:n>', thereby precisely controlling output timing of the delayed falling clock 'fclkd'.

Figure 5:
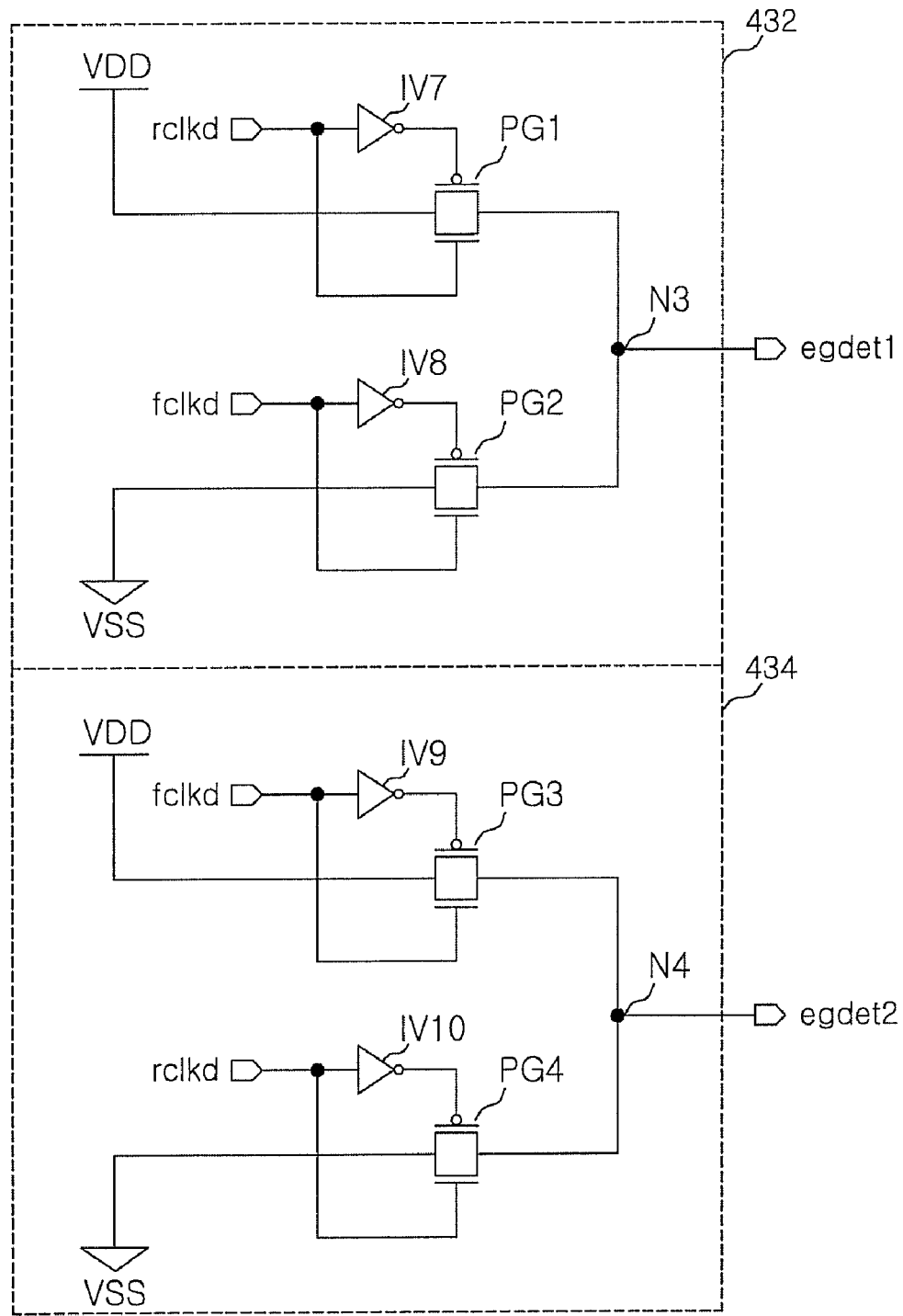
FIG. 5 is a detailed block diagram illustrating a configuration of an edge detection device shown in FIG. 3.

FIG. 5 is a detailed block diagram illustrating a configuration of the edge detection device shown in FIG. 3.

As illustrated in FIG. 5, the edge detection device 430 can include a first edge detection unit 432 and a second edge detection unit 434.

In more detail, the first edge detection unit 432 can be configured to detect time difference between the rising edge timing of the delayed rising clock 'rclkd' and the rising edge timing of the delayed falling clock 'fclkd' to generate the first edge detection signal 'egdet1'. Further, the second edge detection unit 434 can be configured to detect time difference between the rising edge timing of the delayed falling clock 'fclkd' and the rising edge timing of the delayed rising clock 'rclkd' to generate the second edge detection signal 'egdet2'.

The first edge detection unit 432 can include a third node N3 that outputs the first edge detection signal 'egdet1', a seventh inverter IV7 that receives the delayed rising clock 'rclkd', a first pass gate PG1, an eighth inverter IV8 that receives the delayed falling clock 'fclkd', and a second pass gate PG2. The first pass gate PG1 can be configured to transfer external supply voltage 'VDD' to the third node N3 in response to the delayed rising clock 'rclkd' and an output signal of the seventh inverter IV7. The second pass gate PG2 can be configured to transfer ground voltage 'VSS' to the third node N3 in response to the delayed falling clock 'fclkd' and an output signal of the eighth inverter IV8.

The second edge detection unit 434 can include a fourth node N4 that outputs the second edge detection signal 'egdet2', a ninth inverter IV9 that receives the delayed falling clock 'fclkd', a third pass gate PG3, a tenth inverter IV10 that receives the delayed rising clock 'rclkd', and a fourth pass gate PG4. The third pass gate PG3 can be configured to transfer the external supply voltage 'VDD' to the fourth node N4 in response to the delayed falling clock 'fclkd' and an output signal of the ninth inverter IV9. The fourth pass gate PG4 can be configured to transfer the ground voltage 'VSS' to the fourth node N4 in response to the delayed rising clock 'rclkd' and an output signal of the tenth inverter IV10.

According to the above configuration, the first edge detection signal 'egdet1' output from the first edge detection unit 432 has a high level section from the rising edge timing of the delayed rising clock 'rclkd' to the rising edge timing of the delayed falling clock 'fclkd', and a low level section from the rising edge timing of the delayed falling clock 'fclkd' to the rising edge timing of the delayed rising clock 'rclkd'. Further, the second edge detection signal 'egdet2' output from the second edge detection unit 434 has a high level section from the rising edge timing of the delayed falling clock 'fclkd' to the rising edge timing of the delayed rising clock 'rclkd', and a low level section from the rising edge timing of the delayed rising clock 'rclkd' to the rising edge timing of the delayed falling clock 'fclkd'. That is, the first edge detection signal 'egdet1' and the second edge detection signal 'egdet2' may have the high level section wider than the low level section, or the low level section wider than the high level section, and may have phases opposite to each other.

Figure 6:
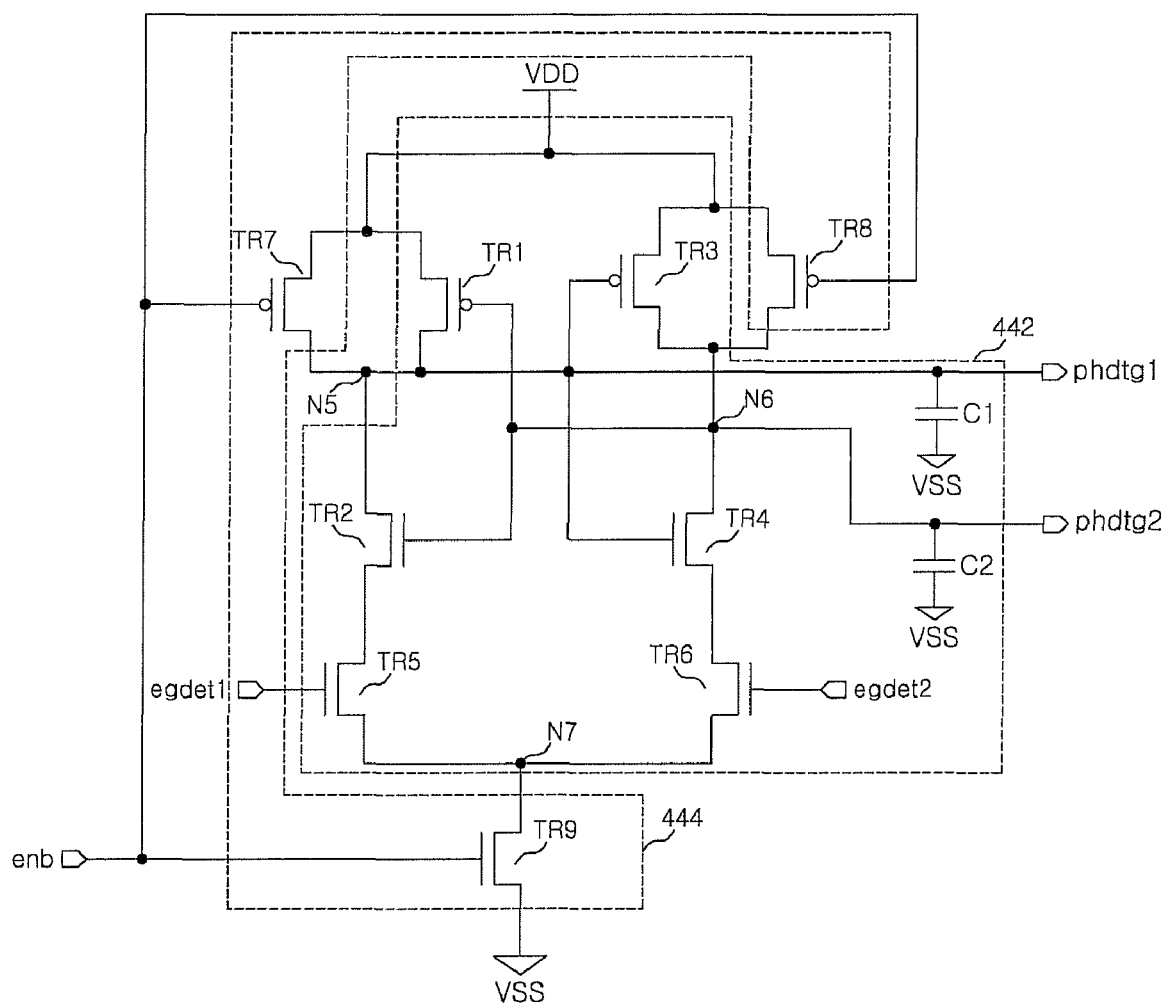
FIG. 6 is a detailed block diagram illustrating a configuration of a phase determination device shown in FIG. 3.

FIG. 6 is a detailed block diagram illustrating a configuration of the phase determination device shown in FIG. 3.

As illustrated in FIG. 6, the phase determination device 440 can include an amplification unit 442 and a control unit 444. The amplification unit 442 can be configured to differentially amplify the first edge detection signal 'egdet1' and the second edge detection signal 'egdet2' to generate the first phase determination signal 'phdtg1' and the second phase determination signal 'phdtg2'. The control unit 444 can be configured to control an operation of the amplification unit 442 in response to an enable signal 'enb'.

The amplification unit 442 can include a fifth node N5 that outputs the first phase determination signal 'phdtg1', a sixth node N6 that outputs the second phase determination signal 'phdtg2', a first transistor TR1, a second transistor TR2, a third transistor TR3, a fourth transistor TR4, a fifth transistor TR5, a sixth transistor TR6, a first capacitor C1 and a second capacitor C2. The first transistor TR1 has a gate terminal connected with the sixth node N6, a source terminal that receives the external supply voltage 'VDD', and a drain terminal connected with the fifth node N5. The second transistor TR2 has a gate terminal connected with the sixth node N6 and a drain terminal connected with the fifth node N5. The third transistor TR3 has a gate terminal connected with the fifth node N5, a source terminal that receives the external supply voltage 'VDD', and a drain terminal connected with the sixth node N6. The fourth transistor TR4 has a gate terminal connected with the fifth node N5 and a drain terminal connected with the sixth node N6. The fifth transistor TR5 has a gate terminal that receives the first edge detection signal 'egdet1', a drain terminal connected with a source terminal of the second transistor TR2, and a source terminal connected with a seventh node N7. The sixth transistor TR6 has a gate terminal that receives the second edge detection signal 'egdet2', a drain terminal connected with a source terminal of the fourth transistor TR4, and a source terminal connected with the seventh node N7. The first capacitor C1 is disposed between the fifth node N5 and the ground 'VSS'. The second capacitor C2 is disposed between the sixth node N6 and the ground 'VSS'.

The control unit 444 can include a seventh transistor TR7, an eighth transistor TR8 and a ninth transistor TR9. The seventh transistor TR7 has a gate terminal that receives the enable signal 'enb', a source terminal that receives the external supply voltage 'VDD', and a drain terminal connected with the fifth node N5. The eighth transistor TR8 has a gate terminal that receives the enable signal 'enb', a source terminal that receives the external supply voltage 'VDD', and a drain terminal connected with the sixth node N6. The ninth transistor TR9 has a gate terminal that receives the enable signal 'enb', a drain terminal connected with the seventh node N7, and a source terminal connected with the ground.

The enable signal 'enb' is enabled at a high level while the clock control circuit 40 is operating, and can be easily generated by persons skilled in the art using a control circuit such as a mode register set.

In a state in which the enable signal 'enb' is enabled, the first edge detection signal 'egdet1' may have a high level section wider than a low level section. In this case, if the first edge detection signal 'egdet1' is input to the amplification unit 442, potential of the fifth node N5 is toggled between a low level and a high level and a low level section is wider than a high level section. At this time, the sixth node N6 has potential opposite to that of the fifth node N5. Then, as the first edge detection signal 'egdet1' is repeatedly toggled, the first capacitor C1 charges and discharges electric charges of the fifth node N5. Thus, the potential of the fifth node N5 gradually converges to a low level. As a result, the first phase determination signal 'phdtg1' has low-level potential and the second phase determination signal 'phdtg2' has high-level potential.

According to the above principle, in an opposite case, that is, if the first edge detection signal 'egdet1' having the low level section wider than the high level section is input to the amplification unit 442, the first phase determination signal 'phdtg1' has high-level potential and the second phase determination signal 'phdtg2' has low-level potential.

Figure 7:
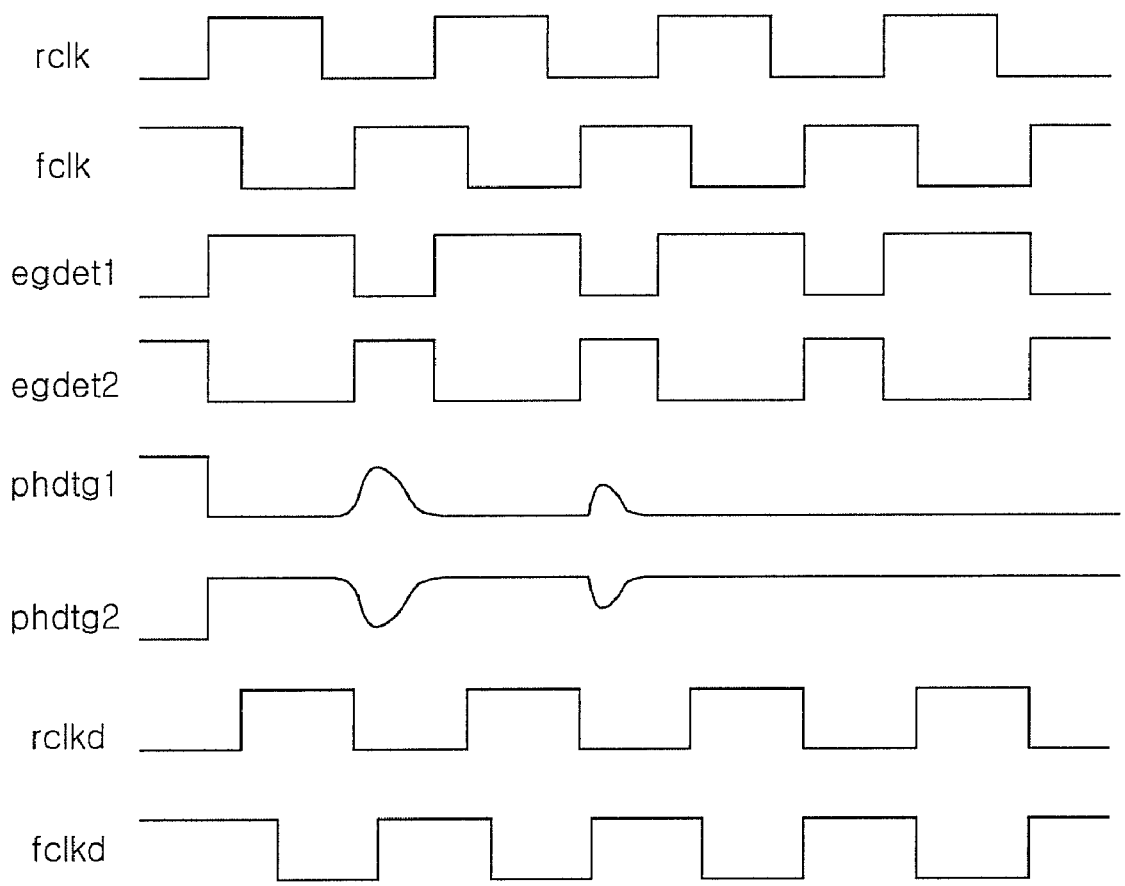
FIG. 7 is a timing chart illustrating an operation of a clock control circuit of the present disclosure.

FIG. 7 is a timing chart illustrating an operation of the clock control circuit of the present disclosure.

Referring to FIG. 7, the rising edge of the rising clock 'rclk' is advanced as compared with the falling edge of the falling clock 'fclk', and the phases of the rising clock 'rclk' and the falling clock 'fclk' are distorted. In such a case, the first edge detection signal 'egdet1' has the high level section wider than the low level section. Further, the second edge detection signal 'egdet2' has a phase opposite to that of the first edge detection signal 'egdet1', and has the low level section wider than the high level section.

Then, the first phase determination signal 'phdtg1' has the low-level potential and the second phase determination signal 'phdtg2' has the high-level potential. The delayed rising clock 'rclkd' and the delayed falling clock 'fclkd', which are generated by controlling the first phase determination signal 'phdtg1' and the second phase determination signal 'phdtg2', have phases opposite to each other.

As described above, the clock control circuit of the present disclosure detects difference between the edge timing of the rising clock and the edge timing of the falling clock, which have distorted phases, to generate the edge detection signals, and determines a duty ratio of the edge detection signals to generate the phase determination signals. Then, the clock control circuit varies the logic values of the control signal having plural bits in response to the phase determination signals, and delays the rising clock and the falling clock according to the logic values of the control signal to generate the delayed rising clock and the delayed falling clock.

The delayed rising clock and the delayed falling clock generated according to the above principle have phases opposite to each other. The semiconductor memory device of the present disclosure performs a buffering operation relative to output data by using the delayed rising clock and the delayed falling clock, thereby improving stability of a data output operation. As a result, an error caused by distortion of a clock in the data output operation can be corrected, so that reliability in the data output operation can be improved.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A clock control circuit comprising:
a clock delay device configured to generate a delayed rising clock and a delayed falling clock by delaying a rising clock and a falling clock, which are transferred from a clock generation circuit, in response to a control signal, and to transfer the delayed rising clock and the delayed falling clock to a data output buffer, wherein the clock delay device includes
a first clock delay device configured to generate the delayed rising clock by delaying the rising clock in response to the control signal, and
a second clock delay device configured to generate the delayed falling clock by delaying the falling clock in response to the control signal;
an edge detection device configured to detect a difference between an edge timing of the delayed rising clock and an edge timing of the delayed failing clock to generate edge detection signals;
a phase determination device configured to detect a duty ratio of each of the edge detection signals to generate phase determination signals; and
a delay control device configured to generate the control signal in response to the phase determination signals.

2. The clock control circuit of claim 1, wherein the first clock delay device includes:
a first delay unit configured to generate a first delayed signal by delaying the rising clock by a first time;
a second delay unit configured to generate a second delayed signal by delaying the rising clock by a second time; and
a phase mixing unit configured to generate the delayed rising clock by mixing a phase of the first delay signal with a phase of the second delay signal in response to the control signal.

3. The clock control circuit of claim 1, wherein the second clock delay device includes:
a first delay unit configured to generate a first delayed signal by delaying the falling clock by a first time;
a second delay unit configured to generate a second delayed signal by delaying the falling clock by a second time; and
a phase mixing unit configured to generate the delayed falling clock by mixing a phase of the first delayed signal with a phase of the second delayed signal in response to the control signal.

4. The clock control circuit of claim 1, wherein the edge detection signals include a first edge detection signal and a second edge detection signal,
and wherein the edge detection device is configured to generate the first edge detection signal, which has a high level section from a rising edge timing of the delayed rising clock to a rising edge timing of the delayed falling clock and a low level section from the rising edge timing of the delayed falling clock to a second rising edge timing of the delayed rising clock, and the second edge detection signal that has a high level section from the rising edge timing of the delayed falling clock to the second rising edge timing of the delayed rising clock and a low level section from the first rising edge timing of the delayed rising clock to the rising edge timing of the delayed falling clock.

5. The clock control circuit of claim 4, wherein the edge detection device is configured to generate the first edge detection signal and the second edge detection signal, each of which has a duty ratio of about 50:50 when the delayed rising clock has a phase opposite to a phase of the delayed falling clock, and wherein the high level section of at least one of the first edge detection signal and the second edge detection signal is wider than the low level section of the at least one of the first edge detection signal and the second edge detection signal when the duty ratio is not about 50:50.

6. The clock control circuit of claim 5, wherein the edge detection device includes:
a first edge detection unit configured to detect a time difference between the first rising edge timing of the delayed rising clock and the rising edge timing of the delayed falling clock to generate the first edge detection signal; and
a second edge detection unit configured to detect a time difference between the rising edge timing of the delayed falling clock and the second rising edge timing of the delayed rising clock to generate the second edge detection signal.

7. The clock control circuit of claim 4, wherein the phase determination signals include a first phase determination signal and a second phase determination signal, and wherein the phase determination device is configured to determine the duty ratio of each of the first edge detection signal and the second edge detection signal and to generate the first phase determination signal and the second phase determination signal, which potential levels are adjusted in opposite directions to each other, according to the determination result.

8. The clock control circuit of claim 7, wherein the phase determination device includes:

an amplification unit configured to generate the first phase determination signal and the second phase determination signal by differentially amplifying the first edge detection signal and the second edge detection signal; and a control unit configured to control an operation of the amplification unit in response to an enable signal.

9. The clock control circuit of claim 1, wherein the control signal includes a digital signal having plural bits, and wherein the delay control device varies a logic value of the control signal in response to the phase determination signals.

10. A method comprising:

generating a delayed rising clock and a delayed falling clock by delaying a rising clock and a falling clock in response to a control signal, wherein the generation of the delayed rising clock and the delayed falling clock includes generating the delayed rising clock by delaying the rising clock in response to the control signal, and generating the delayed falling clock by delaying the falling clock in response to the control signal;

transferring the delayed rising clock and the delayed falling clock to a data output buffer;

detecting a difference between an edge timing of the delayed rising clock and an edge timing of the delayed falling clock to generate edge detection signals;

detecting a duty ratio of each of the edge detection signals to generate phase determination signals; and generating the control signal in response to the phase determination signals.

11. The method of claim 10, wherein the generation of the delayed rising clock includes:

generating a first delayed signal by delaying the rising clock by a first time;

generating a second delayed signal by delaying the rising clock by a second time; and generating the delayed rising clock by mixing a phase of the first delay signal with a phase of the second delay signal in response to the control signal.

* * * * *

UNITED STATES PATENT AND TRADEMARK OFFICE
CERTIFICATE OF CORRECTION

| | | |
|---|---|---|
| PATENT NO. | : 7,944,260 B2 | |
| APPLICATION NO. | : 12/407183 | |
| DATED | : May 17, 2011 | |
| INVENTOR(S) | : Kwan Dong Kim | |

It is certified that error appears in the above-identified patent and that said Letters Patent is hereby corrected as shown below:

Title Page, Item (56) References Cited, FOREIGN PATENT DOCUMENTS should read as follows:

FOREIGN PATENT DOCUMENTS

| | | |
|---|---|---|
| JP | 10-285020 | 10/1998 |
| JP | 2002-042469 | 2/2002 |
| JP | 2005-135567 | 5/2005 |
| KR | 1020040009269 | 1/2004 |
| KR | 1020080020275 | 3/2008 |

Signed and Sealed this
Twelfth Day of July, 2011

David J. Kappos
*Director of the United States Patent and Trademark Office*